(12) United States Patent
Hsu et al.

(10) Patent No.: US 7,381,594 B2
(45) Date of Patent: Jun. 3, 2008

(54) CMOS COMPATIBLE SHALLOW-TRENCH EFUSE STRUCTURE AND METHOD

(75) Inventors: Louis L. Hsu, Fishkill, NY (US); Jack A. Mandelman, Flat Rock, NC (US); William R. Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 11/290,890

(22) Filed: Nov. 30, 2005

(65) Prior Publication Data

US 2007/0120218 A1    May 31, 2007

(51) Int. Cl.
*H01L 21/82*  (2006.01)
*H01L 21/8238*  (2006.01)
*H01L 21/336*  (2006.01)
*H01L 21/331*  (2006.01)

(52) U.S. Cl. .................. 438/132; 438/215; 438/281; 438/333

(58) Field of Classification Search ........ 438/131–132, 438/215, 281, 333, 467, 600–601, 957
See application file for complete search history.

(56) References Cited

U.S. PATENT DOCUMENTS

| | | | | |
|---|---|---|---|---|
| 5,525,533 A | * | 6/1996 | Woodruff et al. | ............ 438/394 |
| 6,218,232 B1 | * | 4/2001 | Heo | ............................. 438/238 |
| 7,064,018 B2 | * | 6/2006 | Madurawe | .................. 438/149 |

* cited by examiner

*Primary Examiner*—Chuong A. Luu
(74) *Attorney, Agent, or Firm*—Scully, Scott, Murphy & Preeser, P.C.

(57) ABSTRACT

A semiconductor structure including at least one e-fuse embedded within a trench that is located in a semiconductor substrate (bulk or semiconductor-on-insulator) is provided. In accordance with the present invention, the e-fuse is in electrical contact with a dopant region that is located within the semiconductor substrate. The present invention also provides a method of fabricating such a semiconductor structure in which the embedded e-fuse is formed substantially at the same time with the trench isolation regions.

10 Claims, 11 Drawing Sheets

CMOS COMPATIBLE SHALLOW-TRENCH EFUSE STRUCTURE AND METHOD

FIELD OF THE INVENTION

The present invention relates to a semiconductor structure and a method of fabricating the same. More particularly, the present invention provides a semiconductor structure including at least one e-fuse embedded within a fuse opening (e.g., trench) that is located in a semiconductor substrate. In accordance with the present invention, the e-fuse is in electrical contact with a dopant region that is also present within the semiconductor substrate. The present invention also provides a method of fabricating such a semiconductor structure.

BACKGROUND OF THE INVENTION

Current semiconductors and other similar devices are often manufactured with a large number of fuse elements which are used to invoke the replacement of failing cells or components, and provide direct alternative current (DAC) trimming, etc. During testing of the device, selected fuses are usually blown by either a laser beam or an electrical current, depending on the design of the fuse/device. In an electrical fuse design, electronically programmable fuses are blown by passing a current through the fuse link. The electrical current then causes a permanent change to the resistance of the fuse. The fuses that are blown are selected by one or more programming methods, which are generally known to those skilled in the art.

One-time electrically programmable fuses, also called e-fuses, have become very popular recently, because of the circuit and systems design flexibility that it provides; the e-fuse can be programmed even when the chip is mounted in the package and installed in the system. For example, customers can tailor a design to the specific needs of the application after the product is installed in the field. The e-fuse also enables the freedom to alter the design, or fix any problem that may occur during the life of the product.

The one-time electrically programmable fuse is much smaller than ablative type fuses, resulting in circuit density advantages. Although e-fuses provide the above-mentioned benefits, integration with standard complementary metal oxide semiconductor (CMOS) processing has been problematic. Furthermore, obtaining a tight distribution of blow voltages derived from normal operating voltages continues to be challenging.

SUMMARY OF THE INVENTION

In view of the state of prior art e-fuses mentioned above, there is a need to provide a semiconductor structure including at least one e-fuse and fabrication method which is easy to integrate with standard semiconductor technologies, thus minimizing implementation costs. Therefore, the present invention provides a semiconductor structure containing at least one e-fuse embedded within a fuse opening, e.g., trench, wherein the e-fuse is formed substantially at the same time as that of the trench isolation regions. More specifically, the e-fuse of the present invention is placed inside a fuse opening (e.g., trench) with its terminals connected to doped regions that are present in a semiconductor structure.

In accordance with the present invention, the e-fuse is integrated with standard semiconductor technologies such as CMOS front-end-of the-line processing, bipolar processing or BiCMOS (bipolar and CMOS) processing. Moreover, while forming these semiconductor devices, the e-fuse of the present invention is formed in a self-aligned manner with only one extra fuse mask. By "self-aligned manner" it is meant that the e-fuse material is aligned to sidewall portions of the fuse opening, which are defined by semiconductor islands formed in the original semiconductor substrate during formation of the neighboring trench isolation regions.

In general terms, the semiconductor structure of the present invention comprises:

a semiconductor substrate having at least one fuse opening containing an embedded e-fuse, the embedded e-fuse is located on sidewall and bottom wall portions of the at least one fuse opening and is in electrical contact at said sidewall portions with an adjacent doped region located within said semiconductor substrate.

In addition to the semiconductor structure defined above, the present invention also provides a method of fabricating such a semiconductor structure. In general terms, the method of the present invention comprises:

providing at least one fuse opening in a semiconductor substrate, said at least one fuse opening comprising at least a fuse material lining sidewall and bottom wall portions of the at least one fuse opening;

forming adjacent shallow trench isolation regions in said semiconductor substrate, wherein during said forming of said adjacent shallow trench isolation regions an outer edge portion of the fuse material within the at least one opening is trimmed to provide an embedded e-fuse that is aligned to said sidewall portions of said at least one fuse opening that are defined by remaining semiconductor islands; and forming a doped region within said remaining semiconductor islands, wherein said doped region is in electrical contact with said embedded e-fuse.

DETAILED DESCRIPTION OF THE INVENTION

The present invention, which provides a semiconductor structure including at least one e-fuse embedded within a fuse opening, e.g., trench, and a method of fabricating the same, will now be described in greater detail by referring to the following discussion and drawings that accompany the present application. It is noted that the drawings of the present application are provided for illustrative purposes and, as such, they are not drawn to scale. Also, in the various illustrated embodiments, like and corresponding elements are referred to by like reference numerals.

Reference is first made to FIGS. 1-11 which are pictorial representations illustrating the basic processing steps used in one embodiment of the present invention. Particularly, and in the embodiment shown in FIGS. 1-11, a semiconductor-on-insulator (SOI) substrate is used.

Figure 1:
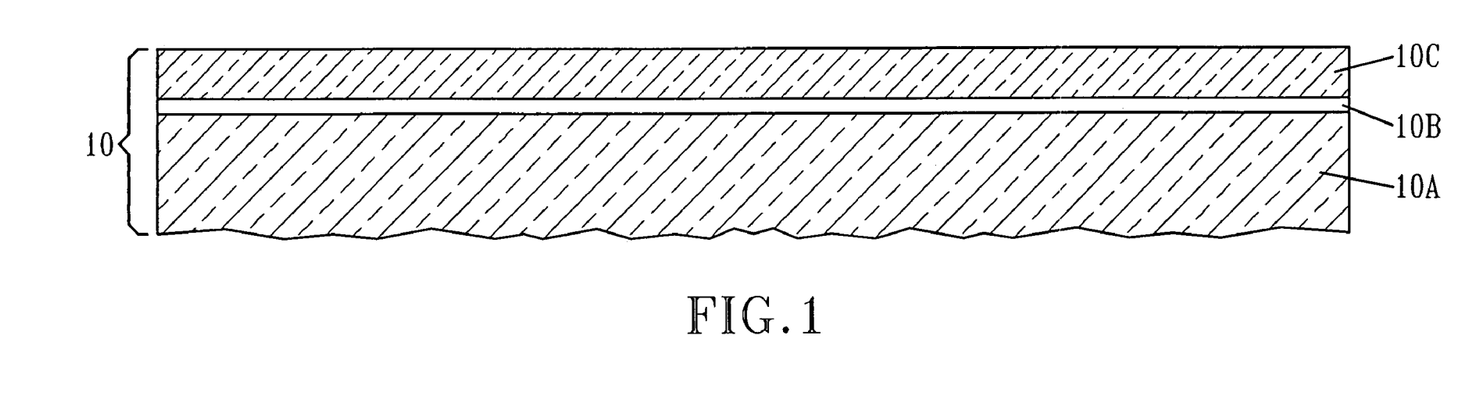
FIGS. 1-11 are pictorial representations illustrating the basic processing steps used in one embodiment of the present invention in which a semiconductor-on-insulator (SOI) substrate is used.

The SOI embodiment of the present invention begins by first providing a semiconductor-on-insulator (SOI) substrate 10 that includes a bottom semiconductor layer 10A, a buried insulating layer 10B, and a top semiconductor layer 10C. The buried insulating layer 10B electrically isolates the top semiconductor layer 10C from the bottom semiconductor layer 10A. As is known to those skilled in the art, the top semiconductor layer 10C of the SOI substrate 10 is the region in which semiconductor devices, such as, FETs and/or bipolar devices, are fabricated.

The top and bottom semiconductor layers (10C and 10A, respectively) may comprise the same, or different semiconductor material. Preferably, the top and bottom semiconductor layers (10C and 10A, respectively) are comprised of the same semiconductor material. The term "semiconductor material" denotes any material that has semiconducting properties. Illustrative examples of semiconductor materials that can be used in the present invention include, but are not limited to: Si, SiGe, SiC, SiGeC, Ge, GaAs, InAs, InP and other II/V or III/VI compound semiconductors. Layered semiconductor materials, such as, for example, Si/SiGe, are also contemplated herein. Typically, the semiconductor layers of the SOI substrate are comprised of a Si-containing semiconductor such as, Si, SiGe, SiC or SiGeC, with Si being even more typical.

The top and bottom semiconductor layers (10C and 10A, respectively) may have the same crystal orientation, or they may have different crystal orientations. In some embodiments, the top and bottom semiconductor layers (10C and 10A, respectively) may be doped, undoped or contain undoped and doped regions therein. The top and bottom semiconductor layers (10C and 10A, respectively) may be strained, unstrained or they may each include regions of strain and unstrain therein.

The buried insulating layer 10B is comprised of a crystalline or non-crystalline oxide, nitride, or oxynitride. In a preferred embodiment, the buried insulating layer 10B is an oxide.

The SOI substrate 10 is fabricated using techniques that are well known in the art including, for example, a layer transfer process, lamination, or by ion implantation and annealing. Typically, and when ion implantation and annealing are used in forming the buried insulating layer 10B, a process known as SIMOX (Separation by Ion Implantation of Oxygen) is used.

The thickness of the various layers of the SOI substrate 10 may vary depending upon the technique that was used in forming the SOI substrate 10. Typically, the top semiconductor layer 10C has a thickness from about 5 to about 200 nm, with a thickness from about 20 to about 100 nm being even more typical. The buried insulating layer typically has a thickness from about 5 to about 500 nm, with a thickness from about 50 to about 200 nm being even more typical. The thickness of the bottom semiconductor layer 10A is typically within ranges of a bulk semiconductor substrate.

Figure 2:
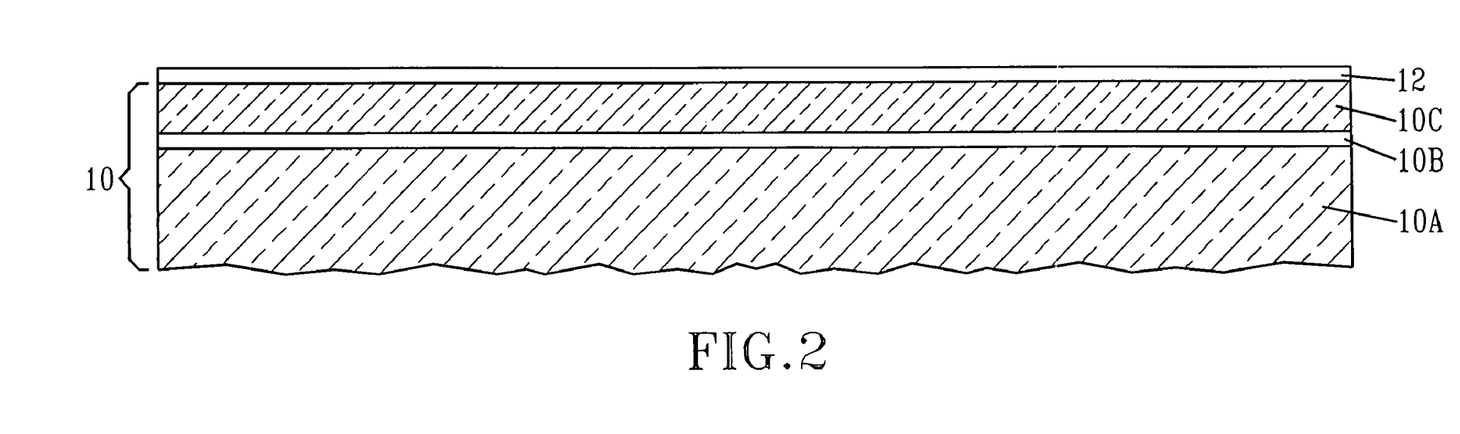

Next, and as shown in FIG. 2, a dielectric cap 12 is formed on a surface of the top semiconductor layer 10C. The dielectric cap 12 may comprise any dielectric material including, for example, oxides, nitrides, oxynitrides, organic polymers, photoresists, or multilayers thereof. Typically, the dielectric cap 12 comprises an oxide, with oxides of Si being highly preferred. The thickness of the dielectric cap 12 formed at this point of the present invention may vary depending upon the type of dielectric cap material employed, the number of layers within the dielectric cap 12, and the technique used in making the same. Typically, and when the dielectric cap 12 is comprised of an oxide, the dielectric cap 12 has a thickness from about 50 to about 500 nm.

The dielectric cap 12 can be formed utilizing a conventional deposition process including, but not limited to: chemical vapor deposition (CVD), plasma enhanced chemical vapor deposition (PECVD), spin-on coating, evaporation, chemical solution deposition, atomic layer deposition and other like deposition processes. Alternatively, the dielectric cap 12 can be formed by a thermal technique including, for example, oxidation, nitridation or oxynitridation. In some embodiments of the present invention, a combination of the aforementioned techniques can be employed in the present invention.

Figure 3:
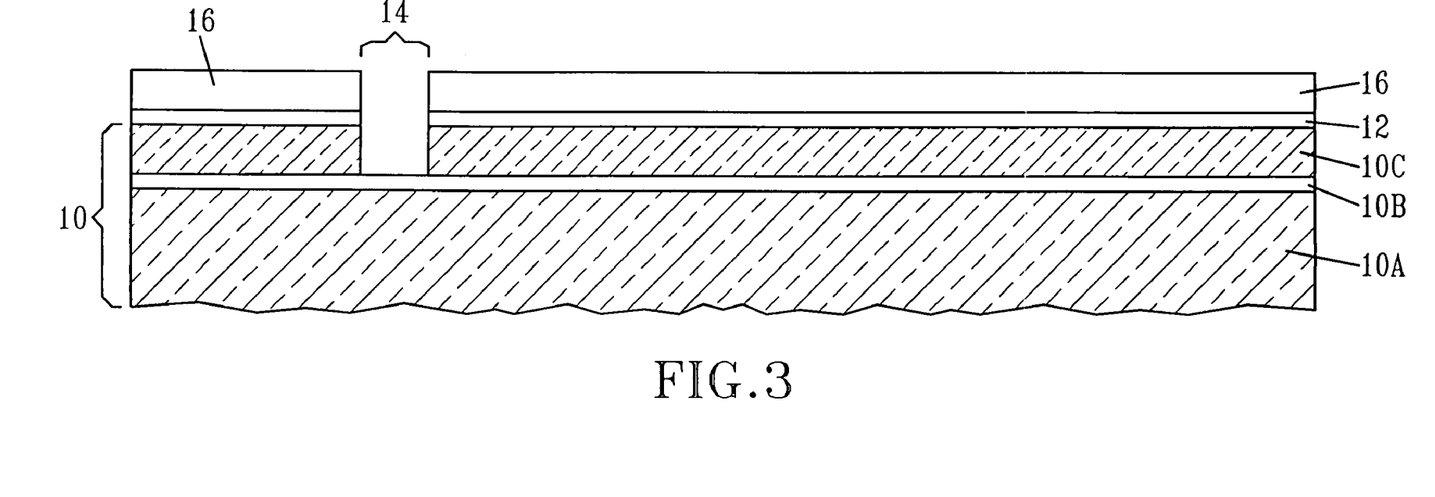

Next, at least one fuse opening (i.e., trench) 14 is formed into the structure. The at least one fuse opening 14 is formed by lithography and etching. Specifically, the at least one fuse opening 14 is formed by first providing a photoresist layer 16 to the surface of dielectric cap 12. This step can be omitted in cases where the uppermost layer of the dielectric cap 12 includes a photoresist. The photoresist layer is formed by a conventional deposition process including, for example, CVD, PECVD or spin-on coating. After applying a photoresist layer, the photoresist layer is patterned by exposing the photoresist layer to a pattern (i.e., trench pattern) of radiation and then developing the exposed resist utilizing a conventional resist developer. The trench pattern is then transferred through the underlying dielectric cap 12 (if it comprises a material other than a photoresist) into a least the top semiconductor layer 12C of the SOI substrate 10. The transfer is achieved utilizing an etching process. The etching process may include a dry etching process (reactive-ion etching, plasma etching, ion beam etching or laser ablation), a chemical wet etching process in which a chemical etchant is employed, or a combination of said etching processes can be used. Typically, a reactive-ion etch is used. FIG. 3 shows the resultant structure including the at least one fuse opening 14. It is noted that FIG. 3 and the remaining drawings assumes that at least a lower portion of the dielectric cap 12 is comprised of an insulating material other than a photoresist.

In FIG. 3, reference numeral 16 denotes a patterned photoresist that is present in the structure. As stated above, the patterned photoresist 16 may represent an uppermost layer of the dielectric cap 12 or a separate layer from the dielectric cap 12.

The depth of the at least one fuse opening 14 may vary. For example, the at least one fuse opening 14 may extend only partially through the top semiconductor layer 10C, it may extend to the surface of, or within, the buried insulating layer 10B, or it can extend down into the bottom semiconductor layer 10A. In FIG. 3, the at least one trench opening 14 extends to a surface of the buried insulating layer 10B. This etching depth is preferred since the subsequently formed fuse material along the bottom wall portion of the at least one fuse opening 14 will be insulated by the buried insulating layer 10B. In embodiments, in which the at least one opening is not in contact with an insulating material, further processing steps are required (See FIGS. 12-16) to provide an insulating material within the at least one fuse opening.

Figure 4:
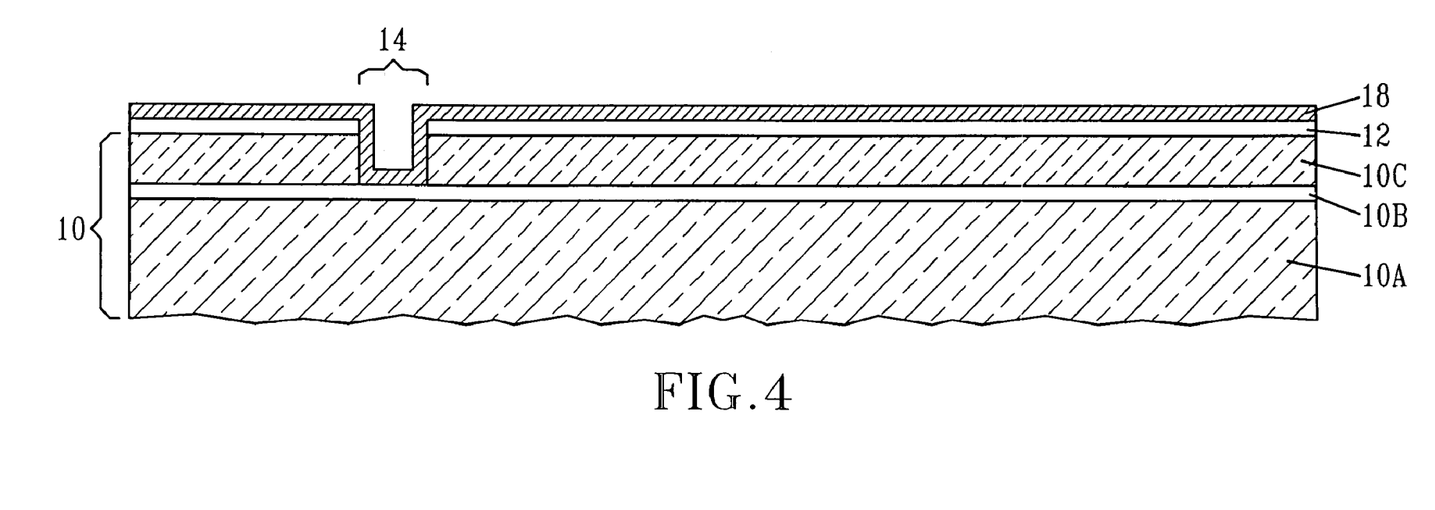

The patterned photoresist 16 is then stripped from the structure utilizing a conventional stripping process well known to those skilled in the art. After stripping of the patterned photoresist 16, a fuse material 18 is then formed on the exposed surfaces of the structure including within the at least one fuse opening 14 utilizing a conventional deposition process. The resultant structure including the fuse material 18 is shown in FIG. 4. The fuse material 18 is typically, but not necessarily, formed on exposed horizontal surfaces of the dielectric cap 12. If the dielectric cap 12 was completely removed, the fuse material 18 can be formed atop the exposed surface of the top semiconductor layer 10C.

As stated above, the fuse material 18 is formed utilizing a conventional deposition process. Illustratively, CVD, PECVD, sputtering, plating, chemical solution deposition, atomic layer deposition or metalorgano deposition may be used. The fuse material 18 comprises a metal, a metal alloy or multilayered stacks thereof. Illustrative examples of fuse materials that can be used in the present invention include, but are not limited to: Ti, Ta, TiN, TaN, W, WN, WSi, TiSi, and mixtures or multilayers thereof. The thickness of the fuse material 18 can vary depending on the type of fuse material employed, the number of layers forming the fuse material 18, and the deposition process used in forming the same. Typically, the fuse material 18 has an as deposited thickness from about 20 to about 300 nm, with a thickness from about 50 to about 250 nm being even more typical.

Figure 5A:
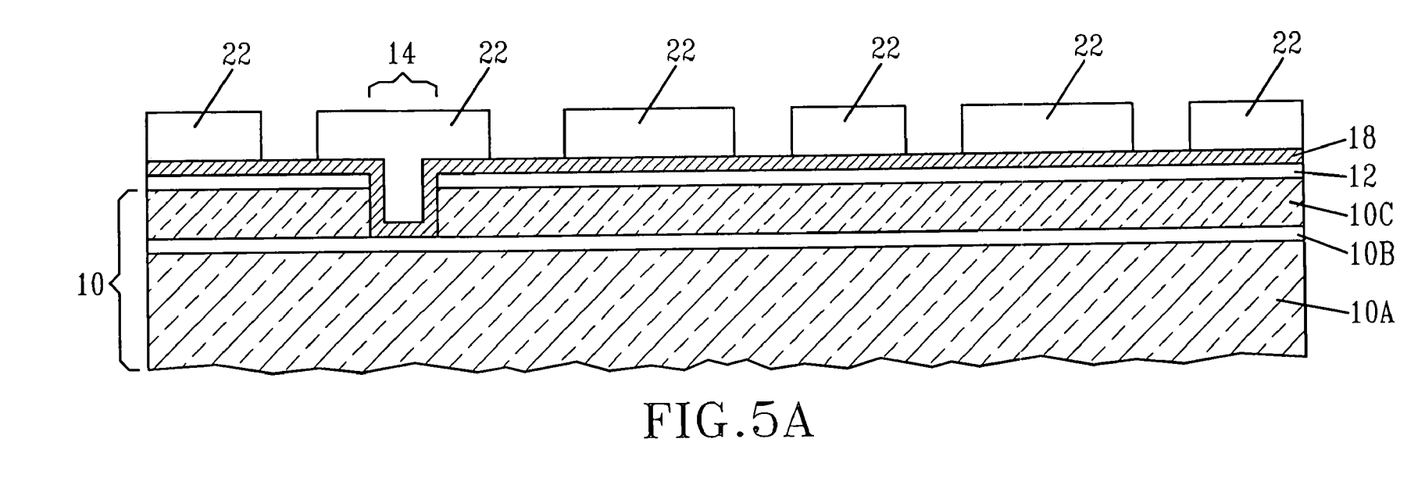
Figure 5B:
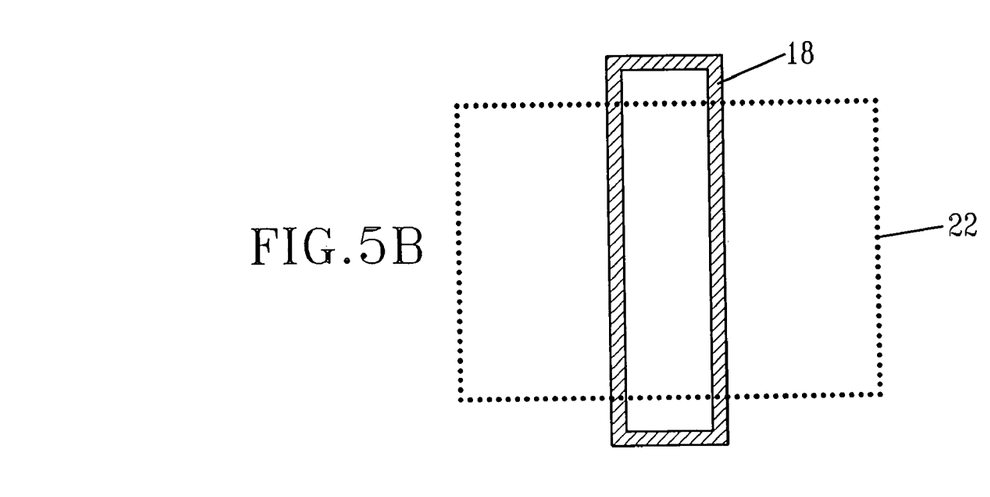
Figure 5C:
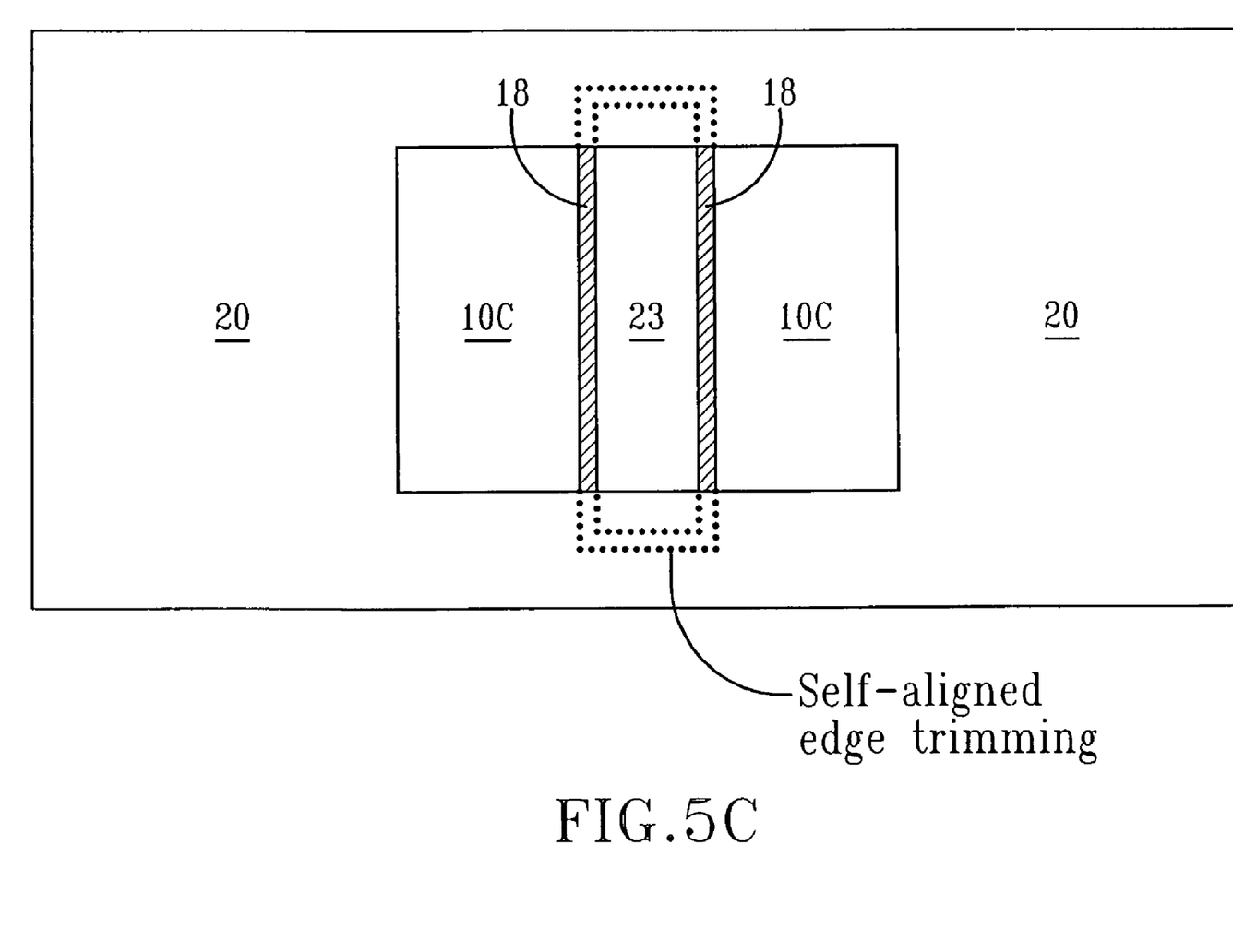

Shallow trench isolation (STI) regions 20 are then formed into the SOI substrate 10 utilizing trench isolation techniques well known in the art. The masking, etching and isolation trench full steps used in forming the STI regions 20 are shown in FIGS. 5A-5C. Specifically, the STI regions 20 are formed utilizing an STI mask 22 that in at least one area intentionally overlaps two edges of the at least one opening 14 containing the fuse material 18 for the purpose of selectively removing fuse material within the at least one fuse opening 14 that is not protected by the STI mask 22. This is illustrated in the views shown in FIGS. 5A-5B. During subsequent etching of the STI trench regions, fuse material not protected by the STI mask 22 within the at least one fuse opening 14 acts as an etch stop layer preventing further etching in those regions. The exposed fuse material 18 is then selectively etched before stripping of the STI mask 22. This step provides self-trimming of the fuse material 18 within outer edge portions of the at least one opening. This is clearly depicted in FIG. 5C. Furthermore, the remaining fuse material 18 within the at least one opening 14 is self-aligned to semiconductor islands on both of its sides. The self-aligned process is similar in some respects to the formation of MOS devices where the gate is self-aligned to the source/drain regions.

In greater detail, the STI regions 20 are formed by first forming a STI mask 22 on the structure shown in FIG. 4 in the configuration mentioned above. The STI mask 22 is comprised of a conventional photoresist material. Although not specifically shown, a hard mask such as a nitride can be formed prior to formation of the photoresist material. The optional hard mask is used to facilitate the planarization of the subsequently formed STI oxide full. The photoresist material is then patterned into the STI mask 22; See FIG. 5A. The STI mask 22 protects at least some of the fuse material 18 within the at least one opening 14, while leaving fuse material at lateral edges of the at least one opening 14 exposed; See FIG. 5B. The lateral edges run inside and outside the cross sectional perspective shown in FIG. 5A. The exposed fuse material 18 not protected by the STI mask 22 is then removed utilizing an etching process that selectively removes the exposed fuse material 18; See FIG. 5C. Typically, a chemical etching process is used to selectively remove the exposed fuse material 18 from the structure. An example of a chemical etchant that can be used for this purpose includes dry etching in a $CF_4$ plasma or reactive ion etching. This etching step exposes the underlying cap dielectric 12. The exposed underlying cap dielectric 12 and portions of the underlying top semiconductor layer 10C are then removed via the same or different etching process, such as reactive-ion etching, forming trenches for the STIs. The STI mask 22 can now be removed utilizing a conventional resist stripping process well known in the art. STI trenches are formed and they are then filled with a trench dielectric including for example a CVD oxide such as TEOS (tetraethylorthosilicate) or a high density plasma oxide, and planarized using a process such as for example, chemical mechanical polishing (CMP) and/or grinding. Note that during STI trench fill, the trench dielectric 23 is also formed within the at least one opening 14 atop the fuse material 18. It is emphasized that during etching of the STI trenches, the remaining top semiconductor layer 10C not etched forms island regions which are surrounded by the STI trenches.

Next, a second planarization process is employed that removes exposed fuse material 18 that was not previously etched from the structure. This second planarization process typically exposes remaining dielectric cap 12. The remaining dielectric cap 12 is then removed utilizing a conventional stripping process which exposes a surface of the top semiconductor layer 10C.

At this point of the present invention at least one semiconductor device including, for example, FETs, bipolar transistors or combinations thereof, can be formed on the exposed top semiconductor layer 10C utilizing techniques that are well known in the art. Thus, although the remaining description specifically describes forming FETs on the surface of the structure containing the e-fuse, the present invention is not so limiting.

When FETs are formed, a gate dielectric 24 is formed on the exposed surface of the top semiconductor layer 10C utilizing a conventional deposition process (e.g., CVD, PECVD or evaporation), a thermal process (e.g., oxidation or nitridation) or a combination of said processes. The gate dielectric 24 may comprise an oxide, a nitride, an oxynitride or multilayers thereof. Typically, the gate dielectric 24 is comprised of an oxide such as, for example, $SiO_2$, $Al_2O_3$, $HfO_2$, $ZrO_2$, $TiO_2$, $La_2O_3$, $Y_2O_3$, and mixtures or multilayers thereof. The thickness of the gate dielectric 24 may vary depending on the gate dielectric material, the number of gate dielectrics within layer 24 and the technique used in forming the same. Typically, the gate dielectric 24 has a thickness from about 0.5 to about 20 nm, with a thickness from about 1 to about 10 nm being even more typical.

After forming the gate dielectric 24, a gate conductor 26 is formed on the gate dielectric 26. The gate conductor 26 is comprised of a conductive material including doped polySi, doped SiGe, a metal, a metal alloy, a metal silicide, a metal nitride or combinations and multilayers thereof. The gate conductor 26 can be formed utilizing a conventional deposition process well known in the art including, CVD, PECVD, sputtering, plating, chemical solution deposition and metalorgano deposition. When polySi or SiGe are used as the conductive material, these materials may be doped utilizing an in situ-doping deposition process or deposition followed by ion implantation. The thickness of the gate conductor 26 may vary. Typically, the gate conductor 26 has a thickness from about 20 to about 180 nm, with a thickness from about 40 to about 150 nm being even more typical.

Figure 6:
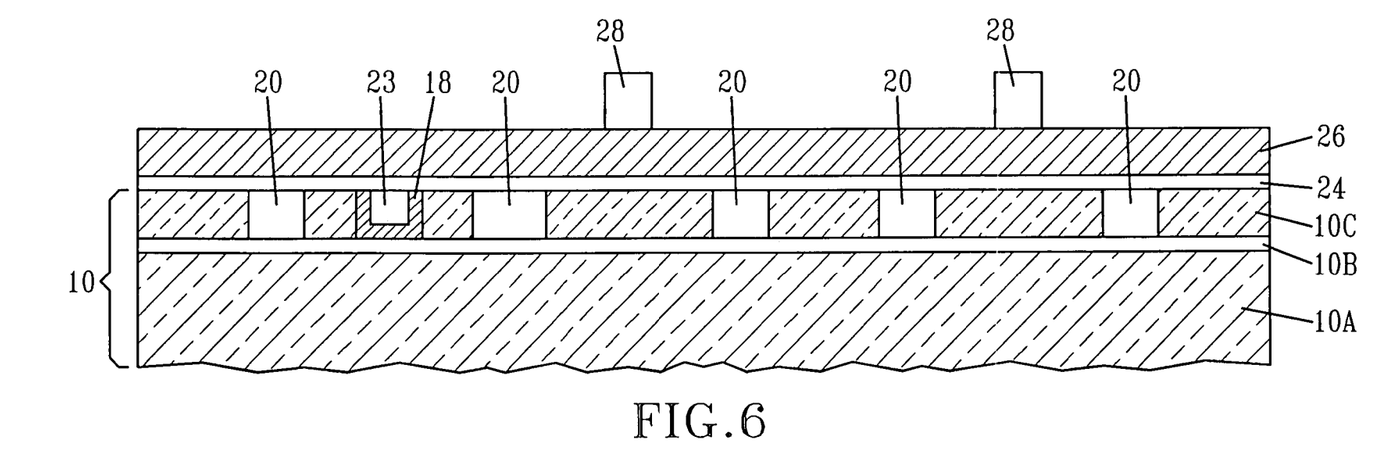

A gate conductor mask 28 is then formed atop the gate conductor 26 by deposition and lithography. The resultant structure including, the gate dielectric 24, the gate conductor 26 and the gate conductor mask 28 is shown in FIG. 6.

Figure 7:
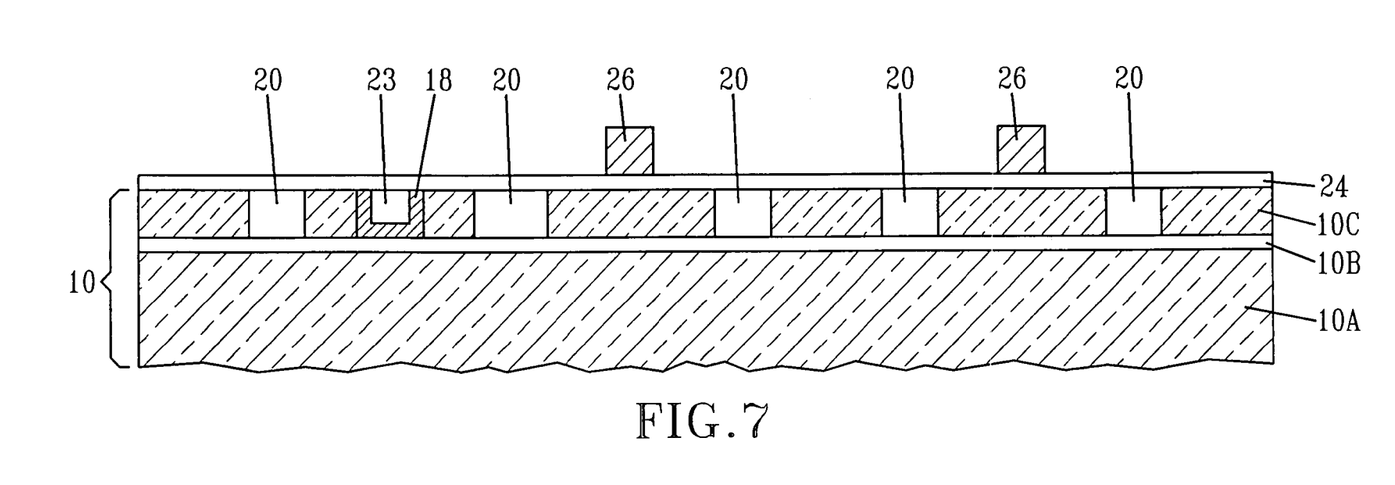

FIG. 7 shows the structure that is formed after etching at least the exposed portion of the gate conductor 26 that is not protected by the gate conductor mask 28. This etching step is performed utilizing either a dry etching process or a chemical wet etching process that is selective in removing the gate conductor 26 as compared to the underlying gate dielectric 24. The gate conductor mask 28 is stripped after etching of the gate conductor 26.

Figure 8:
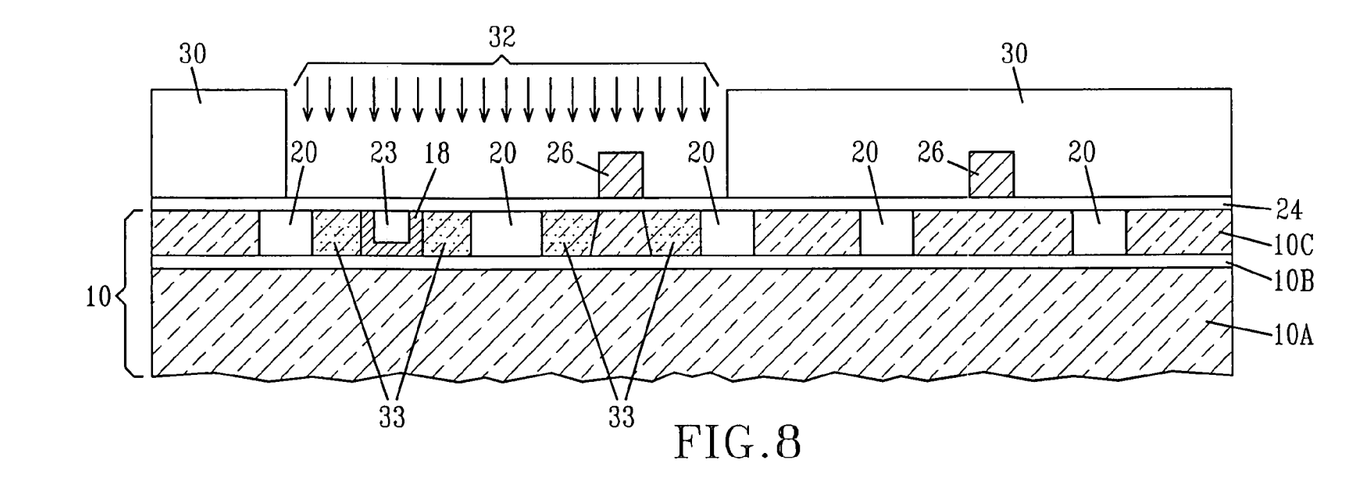

FIG. 8 shows the structure after forming a first implantation mask 30 on the structure shown in FIG. 7 and during implantation of first conductivity ions 32 into exposed portions of the top semiconductor layer 10C. The first conductivity ions 32 may be n-type ions or p-type ions. N-type ions include at least one element from Group VA of the Periodic Table of Elements. Examples of n-type ions are P or As. P-type ions include at least one element from Group IIIA of the Periodic Table of Elements. Examples of p-type ions are B or $BF_2$. In some embodiments, and as shown, the first conductivity ions 32 are formed into the top semiconductor layer 10C of the SOI substrate 10 abutting the fuse material 18. The doped regions of the top semiconductor layer 10C including the first conductivity ions 32 are labeled by reference numeral 33.

The first implantation mask 30 is then stripped and a second implantation mask 34 is formed over areas of the structure that previously were implanted with the first conductivity ions 32. Next, second conductivity ions 36 of a different conductivity type than the first conductivity type ions 32 are implanted into the unprotected portion of the structure not containing the second implantation mask. This step forms doped regions 37 of the second conductivity type within the top semiconductor layer 10C. The structure is shown, for example, in FIG. 9.

Figure 9:
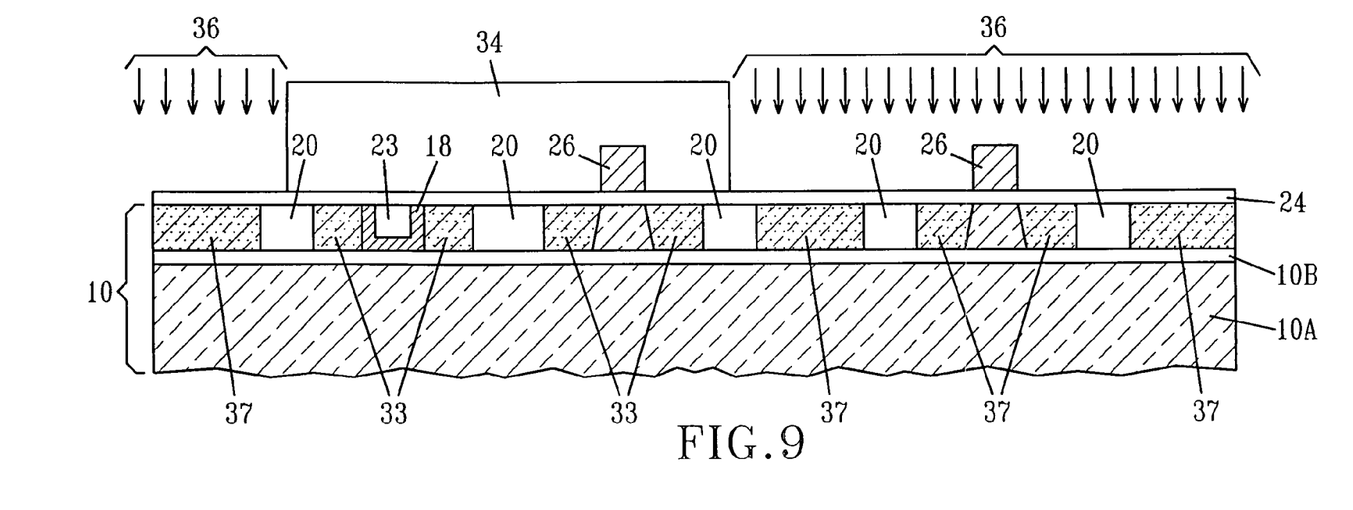

The conditions for implantations mentioned above are conventional and are thus within the knowledge of one skilled in the art. Typically, each of the implant regions has an ion concentration of about $5 \times 10^{18}$ atoms/cm$^3$ or greater. Note that the implanted regions adjacent each of the patterned gate conductors 28 are the corresponding source/drain region of an FET device.

Figure 10:
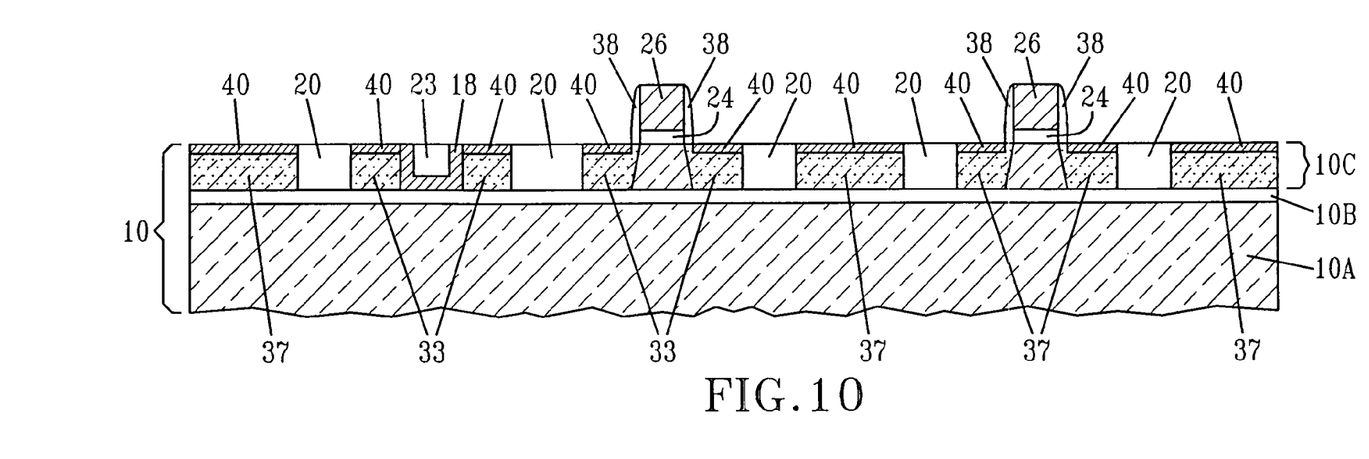

FIG. 10 shows the structure after forming at least one spacer 38 on the sidewalls of the patterned gate conductor 26, stripping the unprotected gate dielectric 24 and after forming silicide regions 40 within each of the implant regions. The at least one spacer 38 may be comprised of an oxide, nitride, oxynitride or a combination thereof. The at least one spacer 38 is formed by deposition and etching. The width of the at least one spacer, as measured along a bottom surface thereof, is from about 20 to about 100 nm. Generally, the spacer width is sufficient wide enough to prevent encroachment of the silicide underneath the gate conductor.

The silicide regions 40 are formed utilizing a conventional self-aligned silicidation process. In instances when the top semiconductor layer 10C is not comprised of a Si-containing semiconductor material, a Si-containing layer can be formed on that non-Si-containing surface to form the silicide. Note that when the gate conductor 26 is comprised of polySi or SiGe, a silicide can also form thereon unless the same is protected prior to silicidation.

The self-aligned silicidation process includes forming a metal or metal alloy that is capable of reacting with a Si-containing material on the exposed surfaces of the structure. The metal or metal alloy may comprise Ti, Pt, W, Ni, Ta, Co, PtNi or another like material that forms a silicide when reacted with a Si-containing material. Any conventional deposition process can be used in forming the metal or metal alloy. An optional oxygen diffusion cap can be formed atop the metal or metal alloy. The optional oxygen diffusion cap comprises TiN, TaN, WN or another like material that prevents oxygen from diffusion into the structure. Any conventional deposition process can be used in forming the optional oxygen diffusion cap.

Next, a first anneal, which may or may not form a silicide in its lowest resistance phase, is performed at a temperature of about 300° C., with a temperature from about 350° to about 650° C. being even more typical. The first anneal may be performed using a continuous heating regime or various ramp and soak cycles can be used. The first anneal is typically carried out in a gas atmosphere such as, for example, He, Ar, $N_2$ or a forming gas anneal. The annealing time may vary depending on the metals or metal alloys used in forming the silicides. Typically, the annealing is performed for a time period from about 5 seconds to about 2 hours. The annealing process may be a furnace anneal, a rapid thermal anneal, a laser anneal, a spike anneal or a microwave anneal.

A selective wet etch process(es) can be used to remove any unreacted metal or metal alloy as well as the optional oxygen diffusion barrier from the structure.

The second annealing step, if performed, is typically carried out at a temperature of about 550° C. or greater, with a temperature from about 600° to about 800° C. being more typical. The second anneal may be performed in the same or different gas atmosphere as the first anneal.

Figure 11:
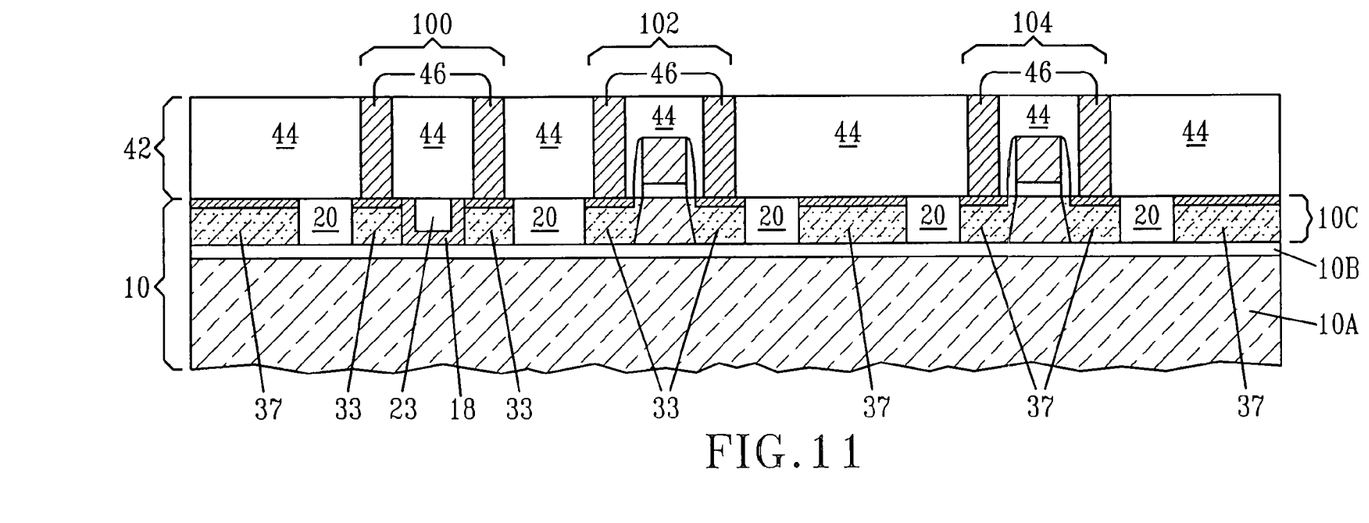

FIG. 11 shows the structure after forming a first interconnect level 42 to the structure shown in FIG. 10. The first interconnect level 42 includes an interlevel dielectric 44 that includes contact openings that are filled with a conductive material 46. The first interconnect level 42 is formed utilizing conventional interconnect technology well known in the art. For example, deposition of the interlevel dielectric 44, providing the contact openings within the interlevel dielectric 44 by lithography and etching, and filling the contact openings with the conductive material 46. A planarization process may follow the filling of the contact openings. The interlevel dielectric 44 comprises an organic and/or inorganic dielectric typically used in interconnect structures. For example, the interlevel dielectric 44 may comprise $SiO_2$, a carbon doped oxide, a thermosetting polyarylene ether, a silsesquioxane, a siloxane or any combination and multilayer thereof. Porous and/or non-porous dielectrics are contemplated in the present invention. The conductive material 46 may comprise doped polySi, a metal, a metal alloy, a metal silicate or combinations and multilayers thereof. Typically, the conductive material 46 is comprised of Cu, Al, W, or a CuAl alloy.

In FIG. 11, reference numeral 100 denotes the location of the inventive e-fuse, reference numeral 102 denotes the location of a FET of first conductivity type, and reference numeral 104 denotes the location of a FET of a second conductivity type. The inventive e-use includes the trimmed self-aligned fuse material 18 remaining in the at least one fuse opening 14. Note that the e-fuse is located on sidewall and bottom wall portions of the at least one fuse opening 14 and is in electrical contact at said sidewall portions with an adjacent doped region. The e-fuse is isolated laterally by STI regions 22 and vertically by insulating material as well.

Reference is now made to FIGS. 12-16 which are pictorial representations illustrating the basic processing steps used in a second embodiment of the present invention. Particularly, and in the embodiment shown in FIGS. 12-16 a bulk semiconductor substrate 50 is used. The bulk semiconductor substrate 50 comprises at least one of the semiconductor materials mentioned in above in connection with the SOI substrate 10. The bulk semiconductor substrate 50 may comprise a single crystal orientation or it may contain surface regions that have different crystal orientations. The latter substrates are hybrid substrates which can be formed utilizing techniques well known in the art. The bulk semiconductor substrate 50 can be doped, undoped or contain doped and undoped regions. Likewise, the bulk semiconductor substrate 50 can be strained, unstrained or contain regions of both strain and unstrain therein.

Figure 12:
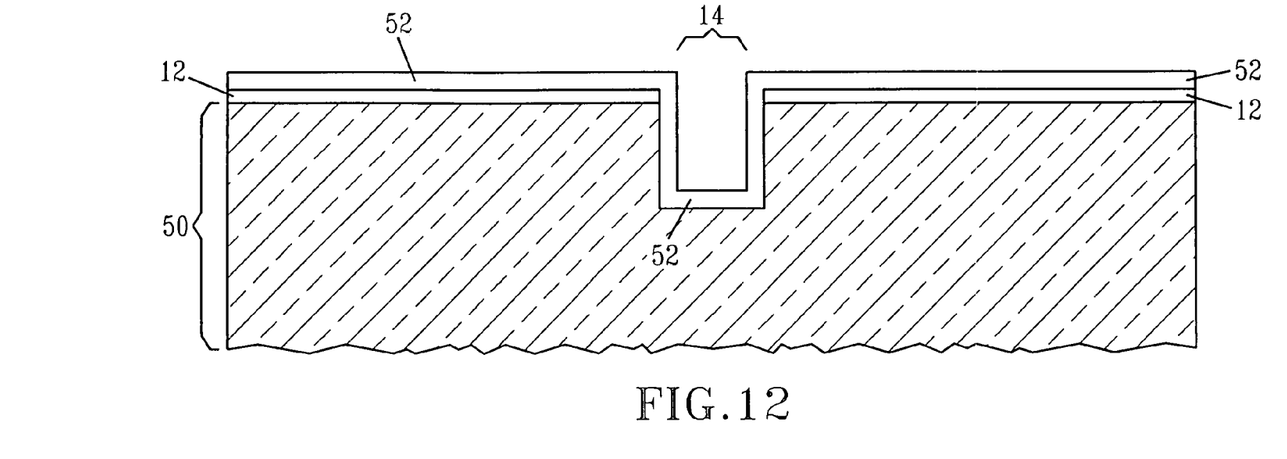
FIGS. 12-16 are pictorial representations illustrating the basic processing steps used in another embodiment of the present invention in which a bulk semiconductor substrate is used.
Figure 13:
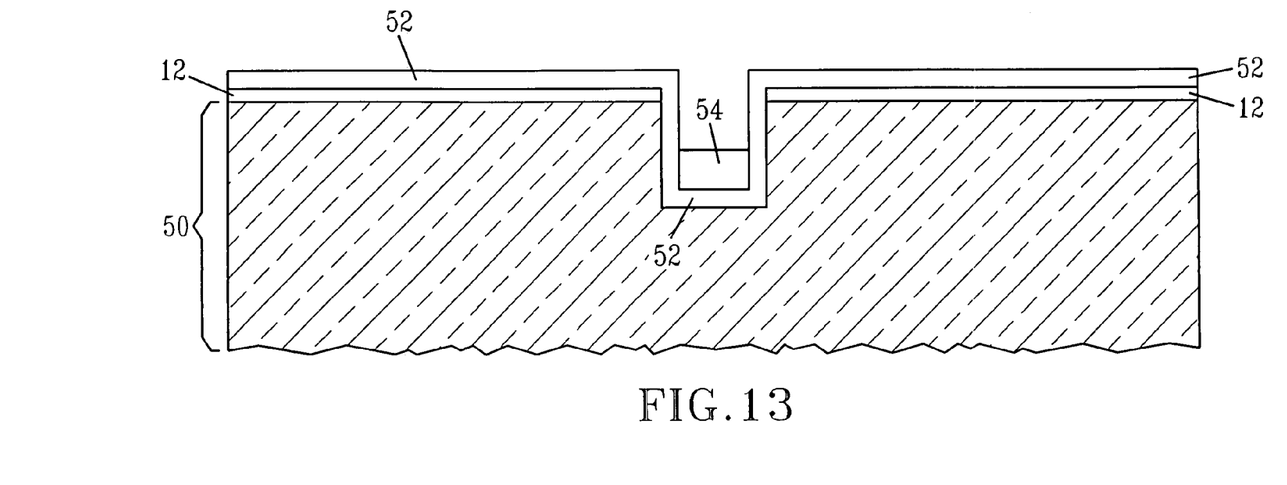
Figure 14:
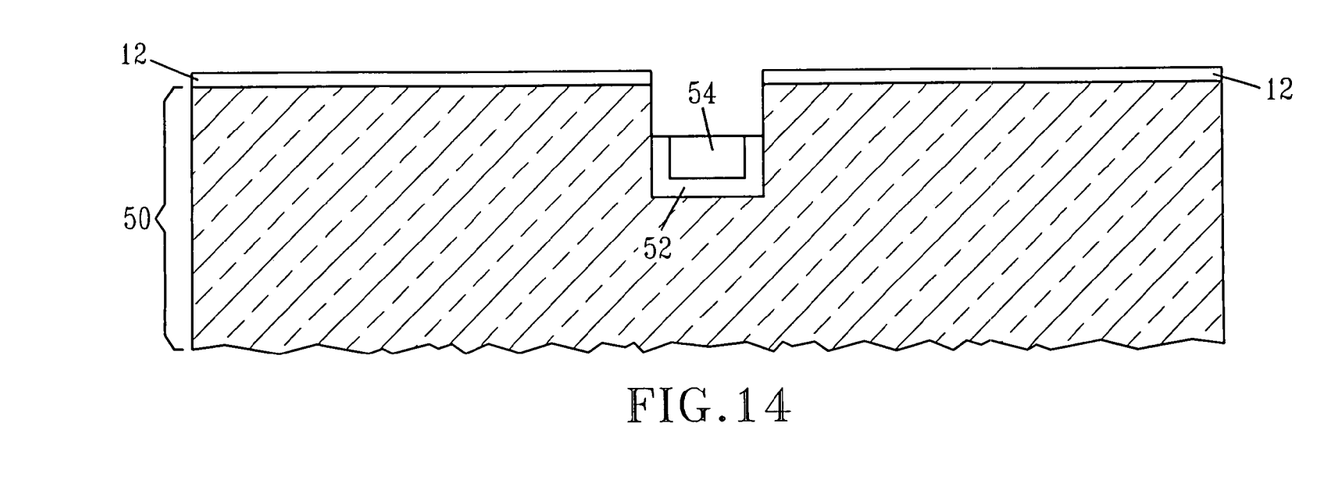
Figure 15:
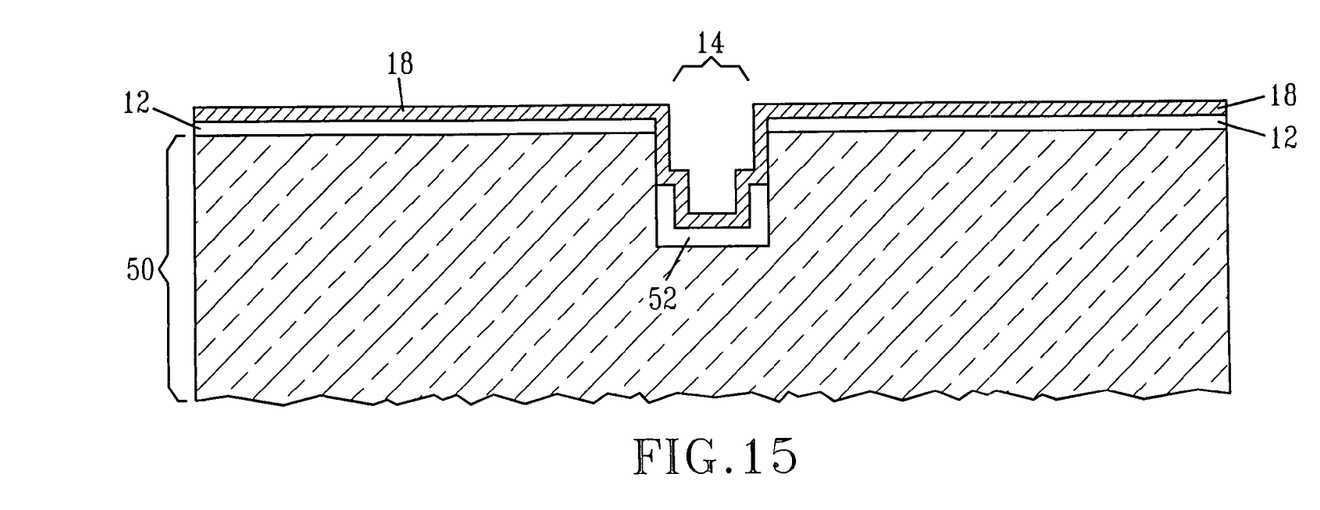

FIG. 12 shows the bulk semiconductor substrate 50 including a nitride or oxynitride dielectric cap 12 on an upper surface of the bulk semiconductor substrate 50. The bulk semiconductor substrate 50 also includes at least one fuse opening (trench) 14 that is lined with an oxide 52. The oxide 52 is formed utilizing any conventional conformal deposition process such as, for example, CVD or PECVD. The oxide 52 may have a thickness from about 5 to about 100 nm, with a thickness from about 10 to about 30 nm being even more typical. The present invention also contemplates other electrical and thermally insulating materials instead of oxide 52.

A polymer or photoresist 54 is applied to the structure shown in FIG. 12 so as to at least fill the at least one opening 14. The polymer or photoresist 54 is formed by a conventional deposition process such as, for example, spin-on, CVD or PECVD, and an etch back process is used to recess the polymer or photoresist 54 within the at least one opening 14. The etch back process comprises a timed etching process such as reactive-ion etching that selectively removes the polymer or photoresist 54. When a polymer is used, the polymer may comprise polyimide, polybutylnorbornene (PNB) or another like organic polymer. Any conventional photoresist material can also be used as the material for layer 54. The resultant structure including the recessed polymer or photoresist 54 is shown, for example, in FIG. 13.

The exposed oxide 52 not covered by the recessed polymer or photoresist 54 is then removed utilizing an isotropical etching process. For example, a BHF solution can be used to remove the exposed oxide 52 from the structure. The resultant structure that is formed after the isotropical etching process has been performed is shown, for example, in FIG. 14. Note that sidewall portions of the bulk semiconductor substrate 50 within the at least one opening 14 are bare. The remaining polymer or photoresist material 54 is then removed from the structure utilizing a conventional stripping process and then fuse material 18 is formed providing the structure shown, for example, in FIG. 15.

Figure 16:
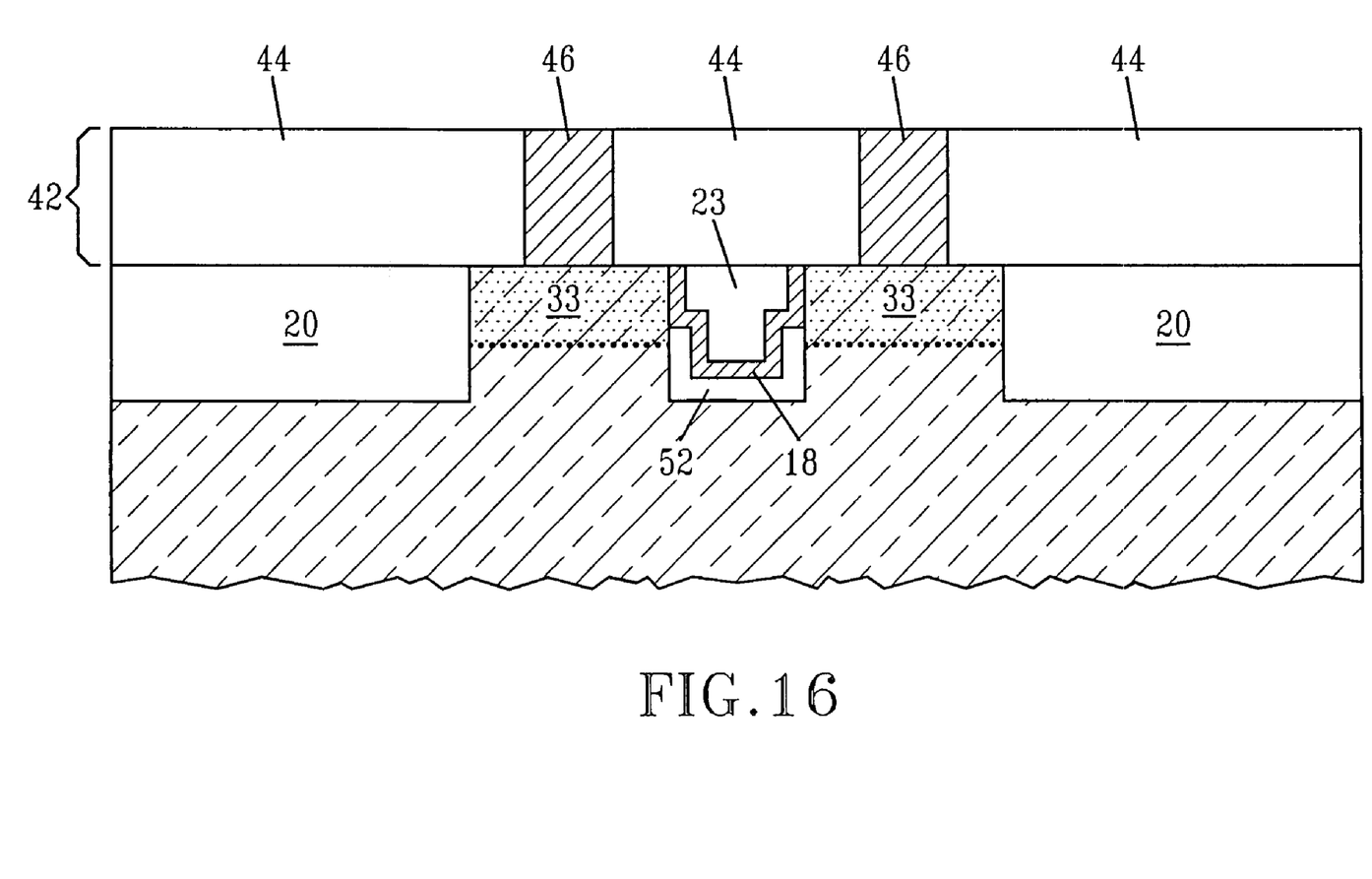

The remaining process steps as used in forming the fuse material 18 within the at least one opening 14 as described in the first embodiment above can now be employed. FIG. 16 depicts a portion of the bulk semiconductor substrate 50 that includes the e-fuse; note only the e-fuse location is shown in FIG. 16 and this drawing also does not show the presence of silicide region which are formed above each of the doped region. The latter omission was performed for clarity.

Figure 17:
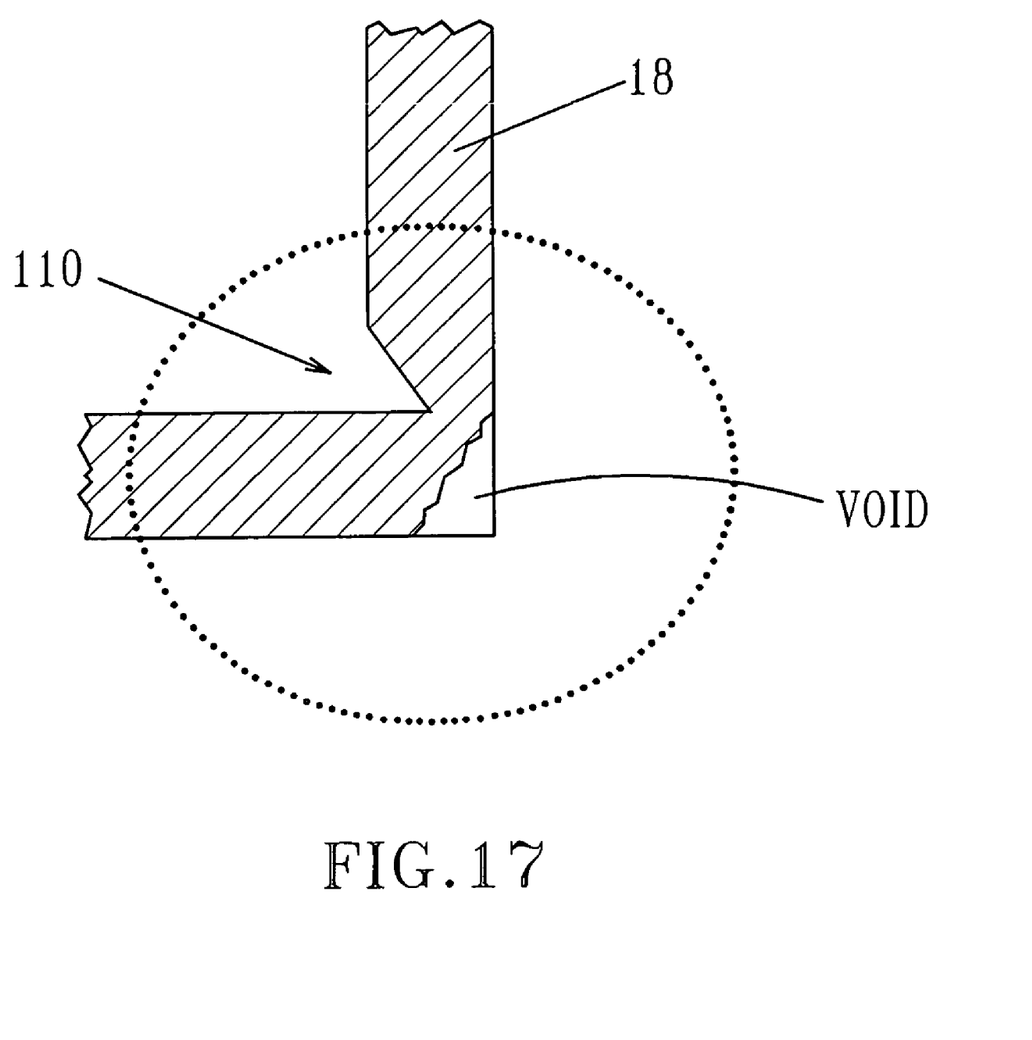
FIG. 17 is an enlarged cross sectional view showing that the e-fuse contains a neck region at the bottom corners of the at least one fuse opening.

It is noted that the processing of the present invention, especially in regard to the first embodiment described above, provides an e-fuse material 18 inside the at least one opening 14 that presents a neck 110 at the bottom corners of the at least one opening 14. See, for example, FIG. 17. These necks result in current crowding during programming. When current pulse carries sufficient energy it can instantly generate a very high temperature in the vicinity of the neck regions and thus melt the fuse material 18 and cause it to open. Thus, the physical location of the fuse blow is extremely repeatable. The buried insulating layer 10B (or oxide layer 52) and the STI regions 20 wrap around the fuse material 18 in the at least one opening 14 in such a way that a poor thermal path results between the fuse material 18 and the adjacent semiconductor material. As a result of the insulating material, the fuse material 18 may be programmed at lower current densities than what is normally required. In short, a relatively simple and highly manufacturable process for forming an e-fuse is provide, with high reproducible characteristics, within at least one opening 14.

While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of fabricating a semiconductor structure comprising:

providing at least one fuse opening in a semiconductor substrate, said at least one fuse opening comprising at least a fuse material lining sidewall and bottom wall portions of the at least one fuse opening;

forming adjacent shallow trench isolation regions in said semiconductor substrate, wherein during said forming of said adjacent shallow trench isolation regions an outer edge portion of the fuse material within the at least one opening is trimmed to provide an embedded e-fuse that is aligned to said sidewall portions of said at least one fuse opening that are defined by remaining semiconductor islands; and forming a doped region within said remaining semiconductor islands, wherein said doped region is in electrical contact with said embedded e-fuse.

2. The method of claim 1 wherein said providing said at least one fuse opening includes lithography and etching, said etching stops atop a buried insulating layer of a semiconductor-on-insulator substrate.

3. The method of claim 1 wherein said providing said at least one fuse opening comprises forming an electrical or thermally insulating material on at least said bottom wall prior to forming said fuse material.

4. The method of claim 1 wherein during said forming of adjacent shallow trench isolation regions trench dielectric material is filled within said at least one fuse opening.

5. The method of claim 1 wherein said e-fuse comprises a fuse material selected from the group consisting of a metal, a metal alloy and multilayered stacks thereof that is formed by deposition.

6. The method of claim 5 wherein said fuse material comprises one of Ti, Ta, TiN, TaN, W, WN, WSi, TiSi or mixtures and combinations thereof.

7. The method of claim 5 wherein said fuse material has a neck located at bottom corners of the at least one fuse opening.

8. The method of claim 1 wherein said forming the doped region within said remaining semiconductor islands is performed during formation of at least one semiconductor device utilizing an ion implantation process.

9. The method of claim 8 wherein said at least one semiconductor device comprises a field effect transistor.

10. The method of claim 1 further comprising an interconnect level comprising a interlevel dielectric having conductively filled contact openings therein above said semiconductor substrate.

* * * * *